United States Patent
Meir et al.

(10) Patent No.: US 9,583,199 B2
(45) Date of Patent: Feb. 28, 2017

(54) MITIGATION OF DATA RETENTION DRIFT BY PROGRAMMING NEIGHBORING MEMORY CELLS

(71) Applicant: Apple Inc., Cupertino, CA (US)

(72) Inventors: Avraham Poza Meir, Rishon Le-Zion (IL); Eyal Gurgi, Petah-Tikva (IL); Naftali Sommer, Rishon Le-Zion (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/191,108

(22) Filed: Jun. 23, 2016

(65) Prior Publication Data

US 2016/0307631 A1    Oct. 20, 2016

Related U.S. Application Data

(63) Continuation of application No. 14/822,992, filed on Aug. 11, 2015, now Pat. No. 9,401,212, which is a continuation of application No. 14/249,403, filed on Apr. 10, 2014, now Pat. No. 9,136,003.

(51) Int. Cl.
| | |
|---|---|
| *G11C 16/10* | (2006.01) |
| *G11C 16/04* | (2006.01) |
| *G11C 11/56* | (2006.01) |
| *G11C 16/34* | (2006.01) |

(52) U.S. Cl.
CPC .......... *G11C 16/10* (2013.01); *G11C 11/5671* (2013.01); *G11C 16/0466* (2013.01); *G11C 16/3418* (2013.01); *G11C 16/3427* (2013.01)

(58) Field of Classification Search
CPC . G11C 16/10; G11C 16/0466; G11C 16/3418; G11C 16/3527
USPC ............. 365/185.18, 185.11, 185.15, 185.26
See application file for complete search history.

(56) References Cited

U.S. PATENT DOCUMENTS

| | | | |
|---|---|---|---|
| 7,345,898 | B2 | 3/2008 | Park et al. |
| 8,089,804 | B2 | 1/2012 | Kim et al. |
| 8,432,733 | B2 | 4/2013 | Higashitani |
| 8,593,884 | B2 | 11/2013 | Park et al. |
| 2014/0075136 | A1 | 3/2014 | Davies |

*Primary Examiner* — Son Dinh
(74) *Attorney, Agent, or Firm* — Meyertons, Hood, Kivlin, Kowert & Goetzel, P.C.

(57) ABSTRACT

A method includes, in a plurality of memory cells that share a common isolation layer and store in the common isolation layer quantities of electrical charge representative of data values, assigning a first group of the memory cells for data storage, and assigning a second group of the memory cells for protecting the electrical charge stored in the first group from retention drift. Data is stored in the memory cells of the first group. Protective quantities of the electrical charge that protect from the retention drift in the memory cells of the first group are stored in the memory cells of the second group.

20 Claims, 3 Drawing Sheets

MITIGATION OF DATA RETENTION DRIFT BY PROGRAMMING NEIGHBORING MEMORY CELLS

PRIORITY INFORMATION

This application is a continuation of U.S. application Ser. No. 14/822,992, filed Aug. 11, 2015, which is a continuation of U.S. patent application Ser. No. 14/249,403, entitled "MITIGATION OF DATA RETENTION DRIFT BY PROGRAMMING NEIGHBORING MEMORY CELLS," filed Apr. 10, 2014, now U.S. Pat. No. 9,136,003, issued Sep. 15, 2015, which is hereby incorporated by reference in their entirety as though fully and completely set forth herein.

TECHNICAL FIELD

The disclosed embodiments relate generally to memory devices, and particularly to methods and systems for improving data retention in memory cells.

BACKGROUND

Some non-volatile memory devices, such as Flash devices, comprise arrays of memory cells. Data retention refers to the ability of the memory cells to retain reliable reading of the stored data for long periods of time. Methods for achieving data retention in non-volatile memories are known in the art.

For example, U.S. Pat. No. 8,432,733, whose disclosure is incorporated herein by reference, describes techniques for compensating in a non-volatile storage for differences in floating gate coupling effect that are experienced by non-volatile storage elements belonging to different word lines. A set of the non-volatile storage elements are assigned for storing data, and at least one of the non-volatile storage elements, which is a neighbor to one of the data non-volatile storage elements, is assigned as a dummy element that does not store data. After programming the data non-volatile storage elements, a programming voltage is applied to the dummy element so as to create a coupling compensation effect to the neighbor data non-volatile storage element.

U.S. Pat. No. 8,593,884, whose disclosure is incorporated herein by reference, describes a method for data retention. The method includes sampling a plurality of nonvolatile memory devices, which are included in a data storage device, in order to detect retention information for each of the nonvolatile memory devices, and outputting result data derived from the retention information to a host. The host conditionally performs a respective retention operation on each of the nonvolatile memory devices based on the result data.

SUMMARY OF THE EMBODIMENTS

An embodiment provides a method including assigning, in a plurality of memory cells that share a common isolation layer and store in the common isolation layer quantities of electrical charge representative of data values, a first group of the memory cells for data storage, and assigning a second group of the memory cells for protecting the electrical charge stored in the first group from retention drift. Data is stored in the memory cells of the first group. Protective quantities of the electrical charge that protect from the retention drift in the memory cells of the first group are stored in the memory cells of the second group.

In some embodiments, the memory cells include Charge Trap (CT) memory cells, the common isolation layer includes a nitride layer, and the retention drift is caused by drift of the electrical charge in the nitride layer. In other embodiments, the memory cells are arranged in word lines, and assigning the first and second groups includes assigning respective first and second subsets of the word lines, such that each word line of the first subset is separated by at least one word line of the second subset.

In an embodiment, the protective quantities of the electrical charge depend on the data stored in the first group of the memory cells. In another embodiment, the protective quantities of the electrical charge stored in a given memory cell of the second group depend on the data stored in one or more adjacent memory cells of the first group. In yet other embodiment, the protective quantities of the electrical charge are independent of the data stored in the first group of the memory cells.

In some embodiments, the protective quantities of the electrical charge are equal among the memory cells of the second group. In other embodiments, storing the data includes storing boot information.

There is additionally provided, in accordance with an embodiment, a storage apparatus including a plurality of memory cells and a processor. The memory cells share a common isolation layer and are configured to store quantities of electrical charge representative of data values. The processor is configured to assign a first group of the memory cells for data storage, to assign a second group of the memory cells for protecting the electrical charge stored in the first group from retention drift, to store data in the memory cells of the first group, and to store in the memory cells of the second group protective quantities of the electrical charge that protect from the retention drift in the memory cells of the first group.

The disclosed embodiments will be more fully understood from the following detailed description, taken together with the drawings in which:

DETAILED DESCRIPTION OF EMBODIMENTS

Overview

Figure 1:
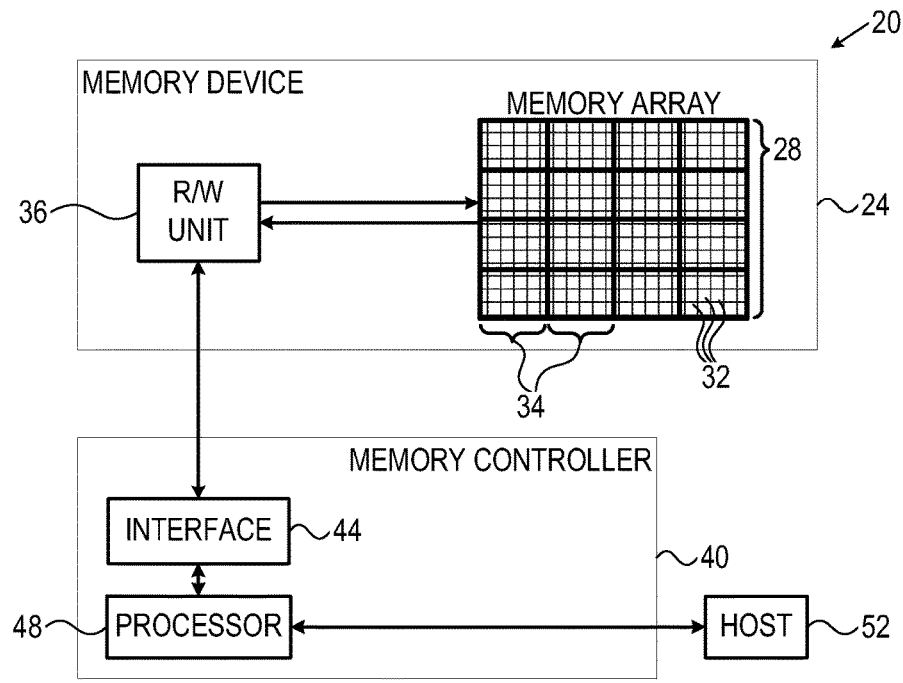
FIG. 1 is a block diagram that schematically illustrates a memory system that supports methods for data retention, in accordance with an embodiment.

Embodiments that are described herein provide improved methods and systems for mitigating charge retention drift in non-volatile memory cells. In some embodiments, a memory controller stores data values in a group of memory cells that share a common isolating layer. The memory cells may comprise, for example, a group of Charge-Trap (CT) Flash memory cells along a bit line, sharing a common nitride layer.

The data values are stored by creating respective quantities of electrical charge in respective regions of the common isolating layer that are associated with the memory cells. In practice, however, the stored electrical charge tends to spread over time in the common isolating layer and drift from the designated regions of the memory cells. This effect is referred to herein as "charge retention drift" or "retention drift." The extent of drift in a given memory cell typically depends on the charge quantities (and thus the data values) stored in other memory cells in the group, and in particular neighboring memory cells. Unless accounted for, retention drift may cause read errors and loss of data.

In the disclosed techniques, the memory controller assigns one group of the memory cells for data storage, and another group of the memory cells for protecting the electrical charge stored in the first group from retention drift. In an example configuration, the memory cells are arranged in bit lines and word lines. The memory controller stores data in alternating (odd-order or even-order) word lines of the memory, and the remaining word lines are assigned for protection from retention drift. As a result, in any given bit line (whose memory cells share a common isolation layer) each memory cell that stores data neighbors two memory cells that are assigned to protect the data.

Allocating part of the memory cells to protect cells that store data from charge drift improves data retention but reduces the useful storage capacity. Therefore, the disclosed techniques are typically used for storing relatively small amounts of critical data, such as, for example, boot sector data, and/or other critical data of the operating system. Alternatively, however, the disclosed techniques can be used for storing any other suitable data.

Memory cells assigned for data storage are referred to herein as "data cells," and memory cells assigned to protect the data cells are referred to herein as "protective cells." To protect the data cells from retention drift, protective cells are typically neighbors to the data cells and should be programmed with suitable quantities of electrical charge as described below. The data represented by the charge quantities programmed to the protective cells is also referred to herein as "protective data."

In some embodiments, for example, in CT memories in which cell charge tends to drift along the nitride layer comprising the bit lines, each data cell should have neighboring protective cells on the same bit line. In an embodiment, data and protective cells are arranged in separate word lines to implement such a neighboring scheme. Word lines comprising only data cells or only protective cells are referred to herein as "data word lines" and "protective word lines," respectively. In some embodiments, at least one protective word line separates between consecutive data word lines.

In one embodiment, a single protective word line separates between each pair of consecutive data word lines. In other words, along bit lines, a data cell in the junction of given word and bit lines is neighbored by a protective cell that belongs to the same bit line and to the previous word line, and by another protective cell that belongs to the same bit line and to the following word line. In this embodiment, half of the memory cells store useful data and the other half store protective data.

In some embodiments, the memory controller programs all the cells in each protective word line with constant protective data. For example, the memory controller can program the cells in the protective word lines to one of the data programming levels, such as, for example, the highest available data programming level. Typically, the memory controller programs all the protective word lines with the same protective data. Alternatively, however, the memory controller may program different protective word lines with different constant data.

In other embodiments, to reduce the retention drift effect, the memory controller determines the protective data based on the data stored in the data cells. For example, an erased data cell may be best protected by neighboring erased protective cells. The memory controller can determine the protective data in a given protective word line based on neighboring data cells of the previous data word line, the following data word line, or both.

In the previous embodiment, since each protective cell is configured to protect retention drift in two memory cells (i.e., belonging to the two data word lines adjacent to the protective word line of the protective cell in question) simultaneously, the level of drift protection may be suboptimal with respect to at least one of the two protected data cells.

In some embodiments, instead of a single protective word line, the memory controller programs two protective word lines between consecutive data word lines. This configuration enables to determine protective data for the memory cells of a given data word line, independently from other data word lines. By allocating two protective cells per data cell, the useful storage capacity reduces to one third of the full capacity.

The disclosed techniques provide improved data retention by allocating memory cells in neighboring word lines with data that protects from retention drift. By using the disclosed techniques, non-volatile memory is capable of storing data for longer periods of time and with improved reliability. Since the disclosed techniques reduce the useful storage capacity, the techniques are particularly useful in storing small-sized data that is critical to the operation of the memory device such as boot information.

System Description

FIG. 1 is a block diagram that schematically illustrates a memory system 20 that supports methods for data retention, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players, and/or any other system or device in which data is stored and retrieved.

System 20 comprises a memory device 24, which stores data in a memory cell array 28. The memory array comprises multiple memory blocks 34. Each memory block 34 comprises multiple memory cells 32. In the context of the present patent application and in the claims, the term "memory cell" is used to describe any memory cell that holds a continuous, analog value of a physical parameter, such as an electrical voltage or charge.

In the embodiments described herein, the data is stored in the memory cells by creating respective charge levels in a common isolating layer. One typical example is CT NAND Flash memory. The techniques described herein can be used, however, with various other types of memory cells, such as CT NOR Flash, or various kinds of Silicon-Oxide-Nitride-Oxide-Silicon (SONOS), Metal-Oxide-Nitride-Oxide-Silicon (MONOS) or Titanium-Alumina-Nitride-Oxide-Silicon (TANOS) memory cells. The memory cell array may be two-dimensional (2-D) or three-dimensional (3-D).

The electrical charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions of the memory controller. In particular, processor 48 stores at least some of the data using, storage schemes that are designed for improved data retention as described in detail below.

Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the disclosed embodiments, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a Charge Trap (CT) cell. The control gates of the CT cells in each row are connected by word lines, and cascades of multiple CT cells in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^7$ memory cells, whereas a page is on the order of $10^4$-$10^5$ memory cells.

Figure 2:
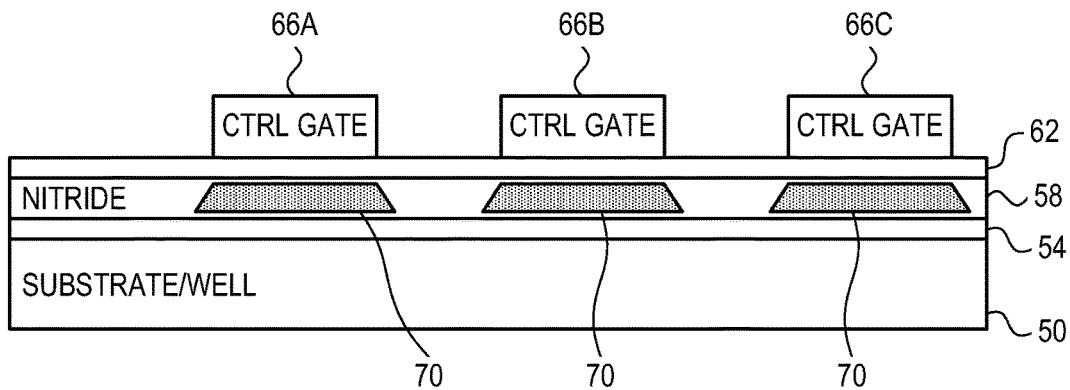
FIG. 2 is a side cross-section view of a Charge Trap (CT) non-volatile memory, in accordance with an embodiment.

FIG. 2 is a side cross-section view of a CT NAND non-volatile memory, in the present example a SONOS-based memory, in accordance with an embodiment. The structure may be planar as in legacy two-dimensional (2-D) NAND Flash memory devices, or vertical as proposed in new three-dimensional (3-D) Flash structures. A substrate 50 typically comprises Silicon or Poly-silicon. An assembly on substrate 50 comprises an oxide layer 54 (referred to as tunnel oxide), a common nitride layer 58 (or any other isolating or blocking layer) and another oxide layer 62 (referred to as gate oxide). Control gates 66 are typically made of Poly-silicon.

The area underneath each control gate 66 functions as a non-volatile memory cell. Data is stored in a memory cell by storing electrical charge 70 in nitride layer 58, underneath the respective control gate. The quantity (and/or polarity) of the electrical charge is indicative of the stored data value.

Typically, R/W unit 36 programs a given memory cell with charge by applying one or more high voltage pulses (e.g., ~20V) to the control gate of that cell. The control gates of the neighboring cells are typically biased with lower voltage (e.g., ~5V) during programming. The R/W unit typically reads from a given memory cell by applying a suitable read voltage to the control gate of the cell, applying to the other controls gates pass voltages that cause the other cells to conduct, and sensing the conductivity of the cascade of memory cells using voltage or current sensing. Erasure of a memory cell is typically performed by applying a high negative voltage to the control gate.

Multiple memory structures of this sort can be used to form a two- or three-dimensional array of memory cells: Multiple cascades of memory cells (such as the cascade shown in FIG. 2) are connected to respective bit lines, and corresponding control gates in the multiple cascades are connected to respective word lines.

In a conventional CT memory, such as the SONOS-based memory shown in FIG. 2, electrical charge 70 tends to spread over time. Gradually, as the charge spreads, the threshold voltages of the cells change and the retention performance of the memory is degraded, causing read errors and loss of data. The charge drifting rate from a given cell may be affected by the charge quantity (or data) stored in neighboring cells. Therefore, programming schemes that are designed to store protective data in neighboring cells can eliminate or minimize the charge drift from data cells.

It is important to distinguish between the charge retention drift effect addressed by the disclosed techniques, and electrical field coupling (sometimes referred to as cross-coupling) between memory cells. Charge retention drift involves actual movement of electrical charge (electrons or holes) from the designated areas of the memory cells, and thus occurs primarily in memory structures in which the charge of multiple cells is stored in a common layer. Electrical field coupling, on the other hand, affects the threshold voltage levels of memory cells without involving actual movement of electrical charge. Electrical field coupling is common, for example, in floating-gate memory structures. Additionally, in contrast to the electrical field coupling effect, retention drift typically changes over time and/or usage of the memory device.

Figure 3:
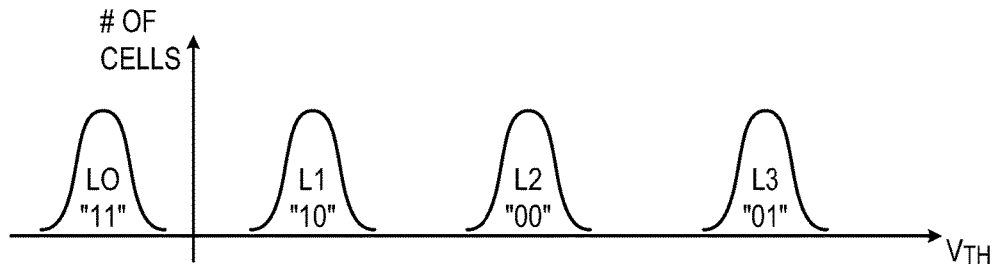
FIG. 3 is a graph that schematically illustrates threshold voltage distributions in a group of memory cells, in accordance with an embodiment.

FIG. 3 is a graph that schematically illustrates threshold voltage distributions in a group of memory cells 32, in accordance with an embodiment. In the present example, the threshold voltages in the group of memory cells 32 are distributed in four programming state distributions L0 . . . L3, each representing a two-bit data value. The left-most "11" programming state L0 also serves as an erased state. Note that in the present example, erased state L0 corresponds to negative threshold voltage, whereas the other programming states L1 . . . L3 correspond to ranges of positive threshold voltages. Generally, however, any of L0 . . . L3 may correspond to positive or negative threshold voltages.

Depending on the stored data, memory cells that are connected to a given bit line may be programmed to different threshold voltages. For example, in the CT example of FIG. 2, the cell controlled by gate 66A may be erased to level L0, whereas the cells controlled by gates 66B and 66C may be programmed to levels L2 and L3 respectively. Programming neighboring cells to different threshold voltages can increase or decrease the charge drift effect in the nitride layer, thus changing the ability of the memory cells to retain data for long periods. As described below, programming schemes in which the memory controller programs certain charge quantities to certain memory cells can minimize the retention drift effect in data cells.

Methods for Improving Data Retention

Figure 4:
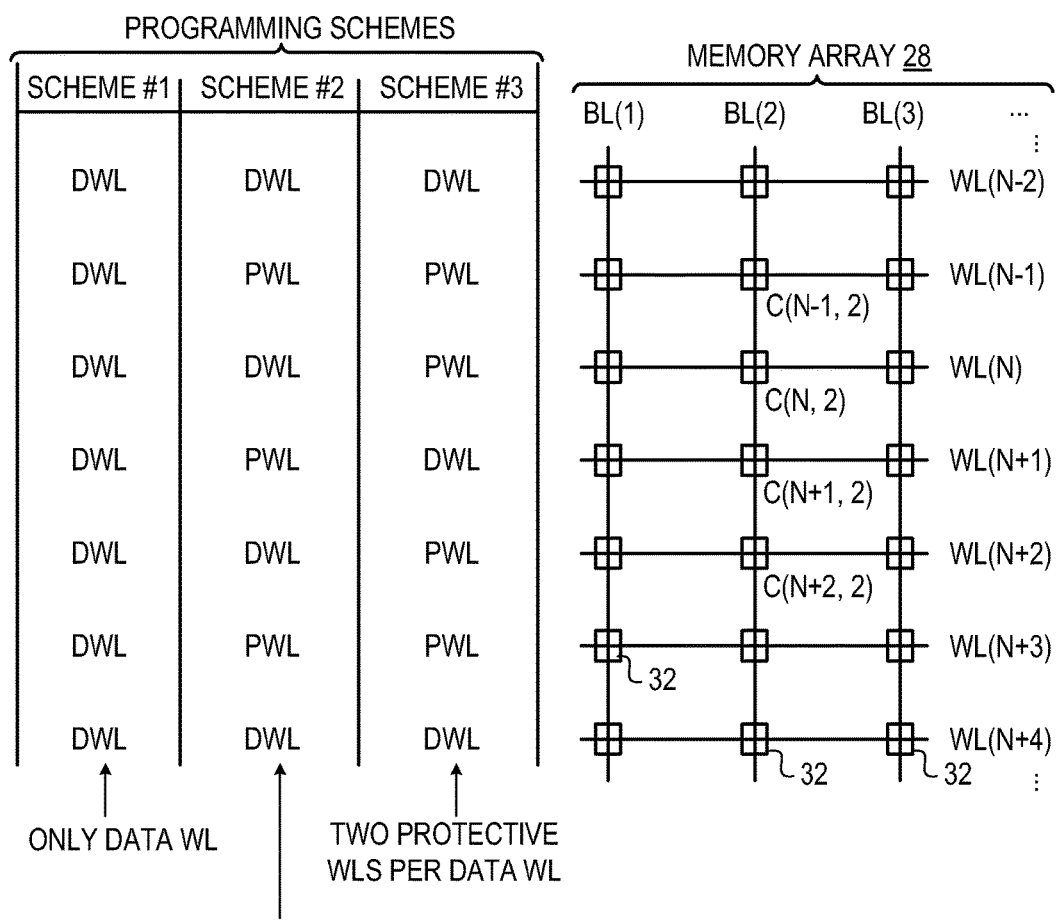
FIG. 4 is a diagram depicting various programming schemes for improving the retention performance in a non-volatile memory, in accordance with an embodiment.

FIG. 4 is a diagram depicting various programming schemes for improving the retention performance in a non-volatile memory, in accordance with an embodiment. In FIG. 4, memory cells 32 of memory array 28 are arranged in a structure comprising bit lines (BLs) and word lines (WLs). Although the figure shows only three bit lines denoted BL(1) . . . BL(3), and seven word lines denoted WL(N−2) . . . WL(N+4), a real-life device may comprise any suitable number of BLs and WLs.

In a CT memory, such as, for example, the SONOS-based memory of FIG. 2, the charge stored in cells 32 of a given BL may spread to nitride layer 58, which is common to the cells of that BL.

The three columns on the left part of FIG. 4, depict three programming scheme in which memory cells 32 can be programmed with user data or with protective data. In the description that follows, memory cells programmed with user or protective data are referred to herein as "data cells" and "protective cells" respectively. In addition, the data stored in data or protective cells is referred to herein as "user data" and "protective data," respectively.

In the figure, the leftmost column refers to a conventional programming scheme, in which all the memory cells are programmed with user data. In the conventional scheme, the rate of charge drifting from memory cells (e.g., to the nitride layer of the BL) is relatively high.

In the disclosed techniques, each data cell is assigned at least one neighboring protective cell. The threshold voltages programmed to the protective cells are selected so as to reduce the rate of charge drifting from the neighboring data cells.

In some embodiments, user and protective cells are arranged in groups of WLs. In other words, all the cells of a given WL comprise data cells or protective cells. WLs comprising only data or protective cells are referred to herein as data WLs (DWLs) or protective WLs (PWLs), respectively. The columns in the programming schemes of FIG. 3 describe programming patterns comprising DWLs and PWLs.

In one embodiment, consecutive data WLs are separated by one protective WL. This configuration is depicted in scheme #2 with alternating data and protective WLs. A protective cell protects charge drifting from its neighboring data cells on the same BL. For example, let C(WL, BL) denote the cell at the junction created by the WL$^{th}$ word line and the BL$^{th}$ bit line. Assuming that WL(N+1) comprises a protective WL, the cell denoted C(N+1, 2) can protect charge drifting from C(N, 2), C(N+2, 2), or from both. Generally, when programmed with suitable protective data, a protective cell can protect from charge drifting in at least the two neighboring data cells that belong to the same BL.

In another embodiment, consecutive data WLs are separated by two protective WLs. Such a scheme is depicted in scheme #3 in the figure. Assuming that WL(N) and WL(N+2) comprise protective WLs, C(N, 2) and C(N+2, 2) mainly protect from charge drifting from the middle data cell, i.e., C(N+1). Similarly, PWL WL(N+1) protects DWL WL(N−1), and PWL WL(N+3) protects DWL WL(N+4).

Figure 5:
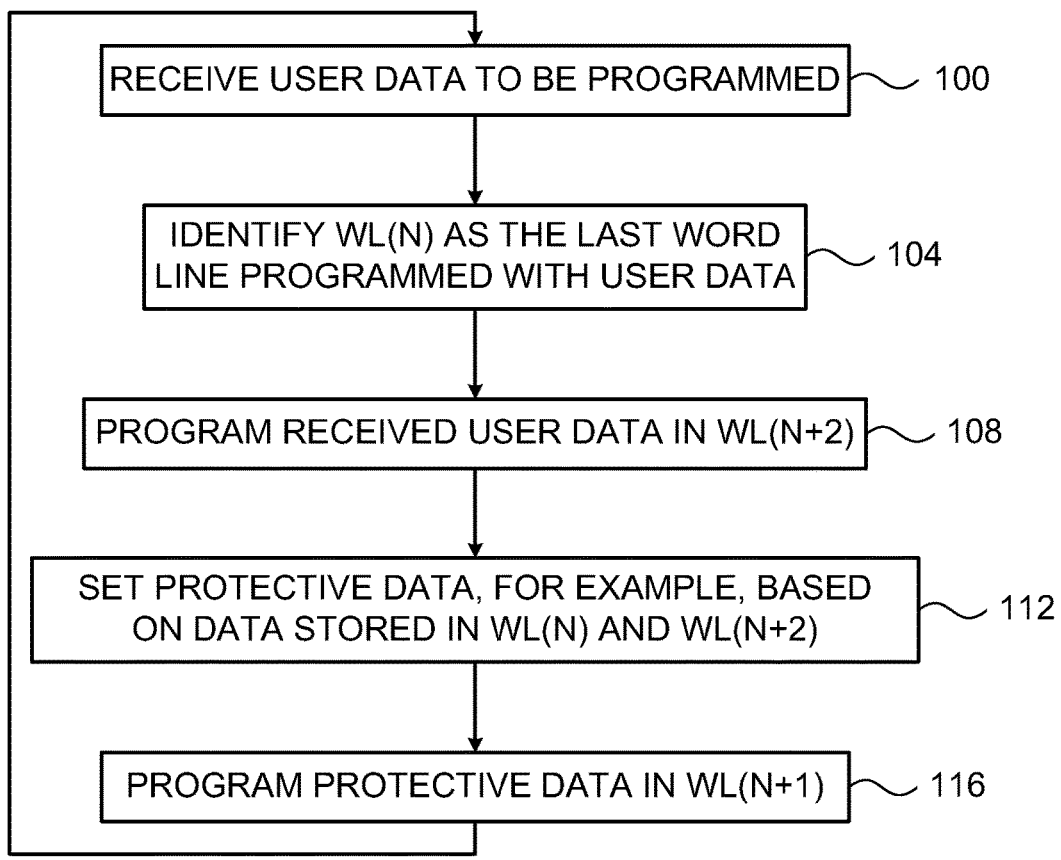
FIG. 5 is a flow chart that schematically illustrates a method for storing protective data to mitigate charge drift from memory cells, in accordance with an embodiment.

FIG. 5 is a flow chart that schematically illustrates a method for storing protective data to mitigate charge drift from memory cells, in accordance with an embodiment.

The method begins with processor 48 receiving data for storage at a reception step 100. The data may comprise a data page such as a Least Significant Bit (LSB) page, a Central Significant Bit (CSB) page or a Most Significant Bit (MSB) page. Alternatively, the data may comprise any other suitable data size. Although in some implementations, programming data page of certain bit significance may result in temporary non-final programming levels, in the present example, writing or programming a WL means that the memory cells of that WL are programmed to their final programming level.

At a WL identification step 104, processor 48 identifies the WL in the memory array that was the last to be written with user data. The processor may, for example, store the corresponding WL index to which user data is programmed, and recover the stored index, at step 104. In the present example the identified WL is WL(N).

At a data programming step 108, processor 48 programs the data received at step 100 in a WL that is separated from the WL identified at step 104 by a single word line. Since at step 104 the processor identifies WL(N), the processor programs the data received at step 100 in WL(N+2), and reserves WL(N+1) for storing protective data.

At a protective data determination step 112, processor 48 determines the optimal data to be programmed in the skipped protective word line WL(N+1). In some embodiments, processor 48 programs all the cells of the protective WL with constant data. For example, processor 48 can program all the cells in the protective WL to the highest programming level L3, or to one of the other programming levels L0 . . . L2. Alternatively, the processor can program the cells of the protective WL to any suitable level other than the levels L0 . . . L3.

When using constant protective data, processor 48 may determine the protective data at step 112 only once, for example, prior to programming the first protective WL. In an embodiment, processor 48 programs the same constant data in all the protective WLs. In alternative embodiments, the processor programs each WL with constant data that can differ among different WLs. For example, for optimal drift protection, the processor may program the first and/or last WLs (when assigned as protective WLs) in array 28 with constant data that is different from the constant data in other protective WLs.

In some embodiments, processor 48 determines the protective data based on the data stored in the neighboring data WLs. For example, to protect charge drifting from an erased data cell, the processor may select to erase its protective neighbor cells as well. As another example, the protective data in a given WL may be selected to be identical to the data to be protected in an adjacent WL.

Note that when data WLs are separated by a single protective WL, the protective data may result in suboptimal protection for at least some of the data cells. For example, assume in FIG. 4 above, that C(N, 2) is an erased data cell and that C(N+2, 2) is a data cell programmed to level L2. In this case, processor 48 should erase C(N+1, 2) to achieve best protection for C(N, 2), but this may provide suboptimal protection to the data cell C(N+2, 2).

In some embodiments, the processor programs the protective cell to the level of the neighbor cell whose programming level is higher among the two neighbor data cells. This selection is useful, for example, when cells that are programmed to higher levels suffer stronger retention drift. According to this rule, C(N+1,2) in the above example should be programmed to L2 instead of being erased.

In other embodiments, the processor determines the protective level as the averages level of the neighbor data cells. According to this rule, C(N,2) in the above example should be programmed to the average of the erase level and L2.

At a protection step 116, processor 48 programs the protective data determined at step 112 in the protective WL that was skipped at step 108. Processor 48 then loops back to step 100, to receive subsequent data for storage.

We now describe a method, which is a variant of the method described in FIG. 5. In this variant method, consecutive data WLs are separated by two protective WLs. Therefore, when at step 104 the previous data WL is WL(N), at step 108 the processor reserves two WLs, and programs the received data in WL(N+3). In addition, at steps 112, processor 48 determines the optimal (i.e., resulting in the lowest retention drift rate) protective data to be stored in WL(N+1) and WL(N+2), and at step 116 stores the two WL with the protective data. In this variant, the processor can determine the optimal protective data in WL(N+1) based only on data WL(N), and independently determine the optimal protective data in WL(N+2) based only on the data stored in WL(N+3).

The methods described above are exemplary methods, and any other suitable methods can be used in alternative embodiments. For example, in the methods described above data cells and protective cells are arranged in WLs. In alternative embodiments, the data and protective cells can be arranged in any other suitable groups.

It will be appreciated that the embodiments described above are cited by way of example, and that the present disclosure is not limited to what has been particularly shown and described hereinabove. Rather, the scope of the disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a plurality of word lines, wherein each word line of the plurality of word lines is coupled to each memory cell of a respective plurality of memory cells; and
circuitry configured to:
store first data in at least one memory cell coupled to a first word line of the plurality of word lines;
store second data in at least one memory cell coupled to a second word line of the plurality of word lines; and
store first protective data in at least one memory cell coupled to a third word line of the plurality of word lines, wherein the third word line is arranged between the first word line and the second word line.

2. The apparatus of claim 1, wherein to store the second data in the at least one memory cell coupled to the second word line, the circuitry is further configured to select the second word line in response to a determination that the at least one memory cell coupled to the first word line is recently programmed.

3. The apparatus of claim 1, wherein the first protective data is dependent upon the first data and the second data.

4. The apparatus of claim 1, wherein to store the first protective data, the circuitry is further configured to erase the at least one memory cell coupled to the third word line.

5. The apparatus of claim 1, wherein the circuitry is further configured to store second protective data in at least one memory cell coupled to a fourth word line, wherein the fourth word line is arranged between the first word line and the second word line.

6. The apparatus of claim 1, wherein the circuitry is further configured to store second protective data in at least one memory cell coupled to a fourth word line of the plurality of word lines, wherein the fourth word line is arranged between the first word line and the second word lines.

7. A method for storing data in a memory, wherein the memory includes a plurality of word lines, the method comprising:

storing first data in at least one memory cell of a first plurality of memory cells, wherein each memory cell of the first plurality of memory cells is coupled to a first word line of the plurality of word lines;

storing second data in at least one memory cell of a second plurality of memory cells, wherein each memory cell of the second plurality of memory cells is coupled to a second word line of the plurality of word lines; and storing first protective data in at least one memory cell of a third plurality of memory cells, wherein each memory cell of the third plurality of memory cells is coupled to a third word line, wherein the third word line is arranged between the first word line and the second word line.

8. The method of claim 7, wherein storing the second data in the at least one memory cell of the second plurality of memory cells includes selecting the second word line in response to determining the first word line was recently programmed.

9. The method of claim 7, wherein the first protective data includes constant data.

10. The method of claim 7, wherein the first protective data is dependent upon the first data and the second data.

11. The method of claim 7, further comprising storing second protective data in at least one memory cell of a fourth plurality of memory cells, wherein each memory cell of the fourth plurality of memory cells is coupled to a fourth word line, and wherein the fourth word line is arranged between the first word line and the second word line.

12. The method of claim 11, wherein the second protective data is dependent upon the first data and the second data.

13. The method of claim 11, wherein the second protective data includes constant data.

14. A system, comprising:
a host; and
a memory, including a plurality of word lines, wherein each word line is coupled to at least one memory cell, and wherein the memory is configured to:
identify a first word line of the plurality of word lines;
receive data from the host;
store the data in at least one memory cell coupled to a second word line of the plurality of word lines; and
store first protective data in at least one memory cell coupled to a third word line, wherein the third word line is arranged between the first word line and the second word line.

15. The system of claim 14, wherein to identify the first word line, the memory is further configured to determine at least one memory cell coupled to the first word line was recently programmed.

16. The system of claim 14, wherein the first protective data includes constant data.

17. The system of claim 14, wherein the first protective data is dependent upon the data and previously stored data, wherein the previously stored data is stored in at least one memory cell coupled to the first word line.

18. The system of claim 14, wherein to store the first protective data, the memory is further configured to erase the at least one memory cell coupled to the third word line.

19. The system of claim 14, wherein the memory is further configured to store second protective data in at least one memory cell coupled to a fourth word line, wherein the fourth word line is arranged between the first word line and the second word line.

20. The system of claim 19, wherein the second protective data is dependent upon the data and previously stored data, wherein the previously stored data is stored in at least one memory cell coupled to the first word line.

* * * * *